Aug. 27, 1963 D. E. BEDSON ET AL 3,102,213

MULTIPLANAR PRINTED CIRCUITS AND METHODS FOR THEIR MANUFACTURE

Filed May 13, 1960 2 Sheets-Sheet 1

Aug. 27, 1963 D. E. BEDSON ETAL 3,102,213

MULTIPLANAR PRINTED CIRCUITS AND METHODS FOR THEIR MANUFACTURE

Filed May 13, 1960 2 Sheets-Sheet 2

United States Patent Office 3,102,213

Patented Aug. 27, 1963

3,102,213
MULTIPLANAR PRINTED CIRCUITS AND METHODS FOR THEIR MANUFACTURE

Donald E. Bedson, Flushing, Salvatore A. Di Nuzzo, Mineola, and Anthony C. Suleski, Bronx, N.Y., assignors to Hazeltine Research, Inc., a corporation of Illinois Filed May 13, 1960, Ser. No. 28,892
12 Claims. (Cl. 317—101)

Figure 1:
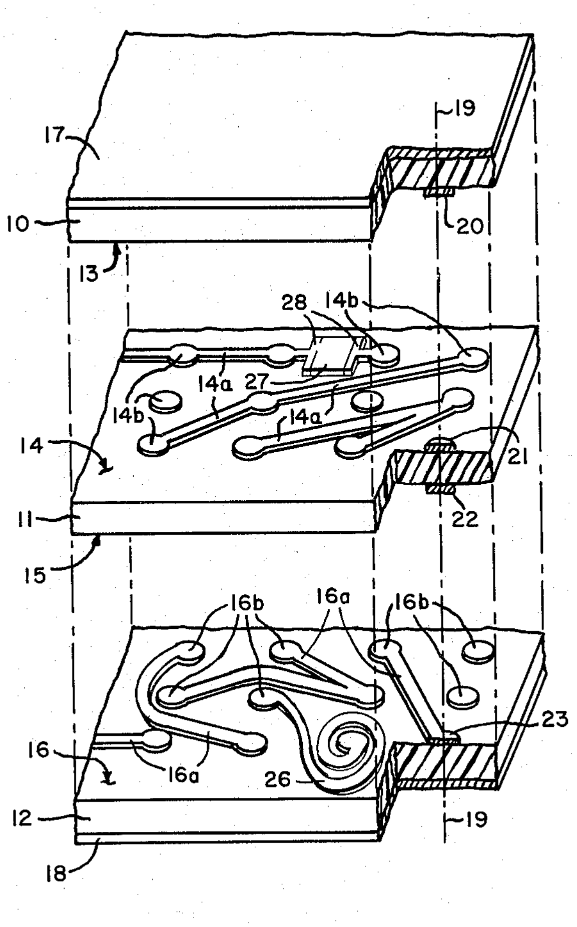

This invention relates to multiplanar printed circuits and methods for manufacturing such circuits. As used in this specification, "multiplanar" refers to a unitary printed circuit having conductors which may exist at a plurality of distinct planes. Generally, the number of such planes will be in excess of two, which is the limitation in the usual types of existing printed circuits. "Seeding" is used to describe the process of placing conductive material on a surface; as for example, by the deposition of chemically reduced copper—a well-known process. Seeding normally produces only a thin base layer of conductive material. "Plating" refers to the process of placing conductive material on a surface by means of an electrical cell in any well-known manner and may be used to build up a layer of practical thickness on top of a thin seeded layer. The term "depositing" is used to describe generally the process of forming a layer of material on a surface and may comprise seeding and then plating, or other appropriate processes. These various processes are efficient to form continuously plated-through holes, i.e. holes through, or partially through, a printed circuit board on the surfaces of which material has been deposited or formed so as to electrically interconnect conductive patterns existing at the various planes of the board.

At the present time the rapidly expanding use of printed circuits is being deterred by certain inherent limitations in existing designs. The usual single insulative sheet, double-sided printed circuit allows only limited conductor crossover. In efforts to achieve more complicated circuitry, the use of a group of such boards, separated by air spaces for insulation, has been suggested. Such schemes have been found impractical because of difficulties in final component assembly and soldering. A further disadvantage of present types of printed circuits is the exposure of the conductive patterns to atmospheric effects.

It is an object of this invention, therefore, to provide a new type of printed circuit which avoids one or more of the disadvantages of the prior art arrangements.

It is a further object of this invention to provide multiplanar printed circuits allowing any desired degree of circuit complexity.

It is an additional object of this invention to provide printed circuits wherein the conductor arrangements are protected from atmospheric effects.

In accordance with the invention, a method of manufacturing multiplanar printed circuits comprises forming a composite board from a stack of insulative sheets having desired conductor configurations on surfaces which become interior in the composite board, each of the sheets having a predetermined pattern of perforations and depositing material on surfaces of the board so as to electrically interconnect, via the perforations, conductor configurations existing at various planes of the board.

Also in accordance with the invention, a multiplanar printed circuit board consists of a stack of insulative sheets having desired conductor configurations adhered thereto and having continuously plated-through holes which electrically interconnect the conductor configurations existing at the various planes of the composite board.

For a better understanding of the present invention, together with other and further objects thereof, reference is had to the following description, taken in connection with the accompanying drawings, and its scope will be pointed out in the appended claims.

In the drawings, FIGS. 1, 2, 3, 4, and 5 illustrate steps in the formation of a multiplanar printed circuit in accordance with this invention. These drawings are not to scale, but have been distorted in an attempt to make normally-small details as understandable as possible.

Referring now to FIG. 1, there are illustrated three insulative sheets 10, 11, and 12, having desired conductor configurations on surfaces 13, 14, 15, and 16. These sheets may be of epoxy glass laminate or other suitable material. In FIG. 1, it will be seen that surfaces 14 and 16 have thereon conductor configurations such as are commonly used in printed circuitry, i.e., strips of conductors **14*a* and 16*a* between respective ones of dots 14*b* and 16*b* of conductive material. Surfaces 13 and 15 also have conductor configurations thereon; however, on these surfaces the patterns are limited to a series of round dots aligned with the round dots at the junctions of the interconnecting conductors on surfaces 14 and 16. Such arrangement will prevent short-circuiting which would tend to occur if interconnecting conductors on adjacent surfaces were placed in close physical relationship. In alternate arrangements, insulative sheets having conductor configurations on only one side, the other side having no dots or conductors, may be used; also, interconnecting conductors can be formed on all of surfaces 13, 14, 15, and 16, in which case blank insulative sheets, carrying no conductive material, placed alternately between sheets 10, 11, and 12 would be effective to provide adequate insulation between adjacent patterns. The remaining sides of sheets 10 and 12 in FIG. 1 are covered by conductive layers 17 and 18, respectively. The dot patterns on the various surfaces are arranged so that particular dots on each surface have common center lines. See, for example, center line 19, 19 which is the center line of the sectional dots 20, 21, 22, and 23, existing on surfaces 13, 14, 15, and 16**, respectively.

Figure 2:
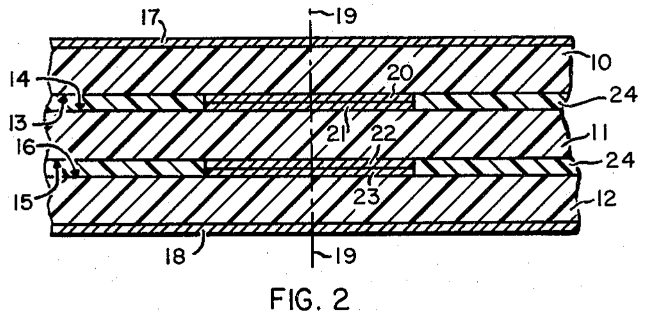

Referring now to FIG. 2, there is shown a sectional view of a small portion of a composite board which has been formed by bonding together three insulative sheets such as those shown in FIG. 1. The dots 20, 21, 22, and 23 of FIG. 1 are shown sectionally with corresponding center line 19, 19. The bonding material is indicated as 24 and may be epoxy resin or other suitable material. A composite board as shown in FIG. 2 may be formed by coating surfaces 13, 14, 15, and 16 with bonding material and placing the superimposed sheets 10, 11, and 12 in a press where heat and pressure are applied. It will now be seen that surfaces 13, 14, 15, and 16 have become interior in the composite board, while the surfaces having thereon conductive layers 17 and 18 have become the two main exterior surfaces.

Figure 3:
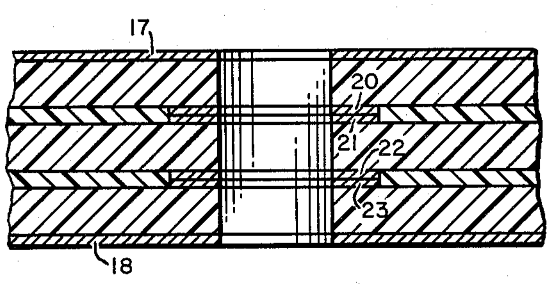

FIG. 3 corresponds generally to FIG. 2 except that a circular hole has ben formed through the composite board through all dots which must be interconnected. The center line of the hole for dots 20, 21, 22 and 23 corresponds substantially to center line 19, 19 of FIG. 2.

Figure 4:
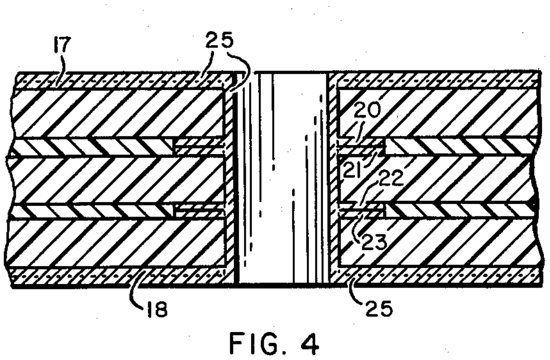

FIG. 4 corresponds generally to FIG. 3 except that material has been deposited on surfaces of the board as, for example, by seeding and then plating copper on the surfaces. Thus, electrically conductive material 25 is shown as covering the surface of the hole as well as the two external conductive layers 17 and 18. The junction between the conductive material originally on the insulative sheets and the newly deposited conductive material is shown dotted to indicate that these conductors are substantially continuous in nature and there is effectively no electrical boundary along the dotted lines.

Figure 5:
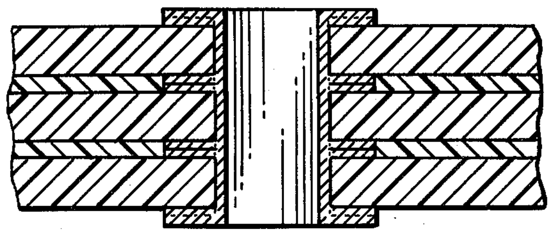

In FIG. 5 the undesired portions of the conductive layers 17 and 18, together with undesired portions of layer 25, have been removed by etching or other well-known process. In this example, a small area, or land, of conductive material has been left surrounding the hole on the two main exterior surfaces. In other arrangements it may be desirable to leave substantialy no land or, alternately, to form an interconnecting pattern of conductors on the exterior surfaces. Forming conductors on the exterior surfaces allows greater circuit complexity with a given number of insulative sheets, whereas if no conductors or lands exist on these exterior surfaces, substantially all conductors will be interior and protected from contact with the atmosphere.

After a board is completed in accordance with the described method, it may be handled as an ordinary printed circuit board, and components may have their leads placed in the plated-through holes and then soldered in place by dip soldering, for example.

Once having the present concept in mind, innumerable variations and arrangements will become apparent to the worker skilled in the art. While it would be impractical to try to describe all the possible arrangements, it is thought that the description of a few of these variations will help to make possible a full appreciation of the present invention. Thus, in one alternate method, the individual insulative sheets as shown in FIG. 1 already have holes in them so as to form a predetermined pattern of perforations. In this method the steps are substantially the same as those described, except that when the individual sheets are accurately registered, holes through the composite board, such as shown in FIG. 3, will be formed without the necessity of drilling holes through the composite board. In another variation, the composite board is formed without conductive layers on the main exterior surfaces, and layers on these surfaces can then be subsequently formed during the seeding and plating processes and utilized in the previously described manner. It is also possible to provide the individual insulative sheets as shown in FIG. 1 with associated circuit components such as resistors and capacitors, for example, affixed to the surfaces which become interior in the finished board so that these components are sealed inside the completed composite board. Finally, broad areas of the conductive layers 17 and 18 may be left on the exterior surfaces with appropriate interconnections so as to provide electrical shielding for the circuitry interior to the composite board. In FIG. 1 examples of such components are shown as an inductor 26 in the form of a spiral conductor and a resistor made up of a section of resistive material 27 between two conductor portions 28.

While there have been described what are at present considered to be the preferred embodiments of this invention, it will be obvious to those skilled in the art that various changes and modifications may be made therein without departing from the invention and it is, therefore aimed to cover all such changes and modifications as fall within the true spirit and scope of the invention.

What is claimed is:

1. The method of manufacturing multiplanar printed circuits comprising: forming a composite board from a stack of insulative sheets having desired conductor configurations on surfaces which become interior in the composite board, each of said sheets having a predetermined pattern of perforations; and depositing material on surfaces of said board so as to electrically interconnect, via said perforations, conductor configurations existing at various planes of the board.

2. The method of manufacturing multiplanar printed circuits comprising: forming a registered composite board from a stack of insulative sheets having desired conductor configurations and associated circuit components on surfaces which become interior in the composite board, each of said sheets having a predetermined pattern of perforations; and seeding and then plating surfaces of said board so as to electrically interconnect, via said perforations, conductor configurations existing at various planes of the board.

3. The method of manufacturing multiplanar printed circuits comprising: forming a registered composite board from a stack of insulative sheets having desired conductor configurations on surfaces which become interior in the composite board, each of said sheets having a predetermined pattern of perforations; depositing material on surfaces of said board so as to electrically interconnect, via said perforations, conductor configurations existing at various planes of the board; an dremoving undesired portions of the deposited material on the exterior surfaces.

4. The method of manufacturing multiplanar printed circuits comprising: forming a composite board by bonding together a stack of insulative sheets having desired conductor configurations on surfaces which become interior in the composite board but having conductive layers covering the surfaces which become the two main exterior surfaces, and each of said sheets having a predetermined pattern of perforations; seeding and then plating surfaces of said board so as to electrically interconnect, via said perforations, conductor configurations existing at various planes of the board; and removing undesired portions of the conductive layers on the exterior surfaces.

5. The method of manufacturing multiplanar printed circuits comprising: forming a composite board from a stack of insulative sheets having desired conductor configurations on surfaces which become interior in the composite board; forming holes through the composite board at predetermined points; and depositing material on surfaces of said board so as to electrically interconnect, via said holes, conductor configurations existing at various planes of the board.

6. The method of manufacturing multiplanar printed circuits comprising: forming a composite board from a stack of insulative sheets having desired conductor configurations on surfaces which become interior in the composite board; forming holes through the composite board at predetermined points; depositing material on surfaces of said board so as to electrically interconnect, via said holes, conductor configurations existing at various planes of the board; and removing undesired portions of the deposited material on the exterior surfaces.

7. The method of manufacturing multiplanar printed circuits comprising: forming a composite board from a stack of insulative sheets having desired conductor configurations on surfaces which become interior in the composite board but having conductive layers covering the surfaces which become the two main exterior surfaces; forming holes through the composite board at predetermined points; and depositing conductive material on surfaces of said board so as to electrically interconnect, via said holes, conductor configurations existing at various planes of the board.

8. The method of manufacturing multiplanar printed circuits comprising: forming a composite board from a stack of insulative sheets having desired conductor configurations on surfaces which become interior in the composite board but having conductive layers covering the surfaces which become the two main exterior surfaces; forming holes through the composite board at predetermined points; depositing conductive material on surfaces of said board so as to electrically interconnect, via said holes, conductor configurations existing at various planes of the board; and removing undesired portions of the conductive layers on the exterior surfaces.

9. The method of manufacturing multiplanar printed circuits comprising: forming a composite board by bonding together a stack of insulative sheets having desired conductor configurations on surfaces which become interior in the composite board but having conductive layers covering the surfaces which become the two main exterior surfaces; forming holes through the composite board at predetermined points; seeding and then plating the surfaces of said board so as to electrically interconnect, via said holes, conductor configurations existing at various planes of the board; and removing undesired portions of the conductive layers on the exterior surfaces so as to form desired conductor configurations on these surfaces.

10. A multiplanar printed circuit board consisting of a stack of insulative sheets having desired conductor configurations adhered thereto and having continuously plated-through holes which electrically interconnect the conductor configurations existing at the various planes of the composite board.

11. A multiplanar printed circuit board consisting of a stack of insulative sheets bonded together, said sheets having desired conductor configurations adhered thereto and said board having continuously plated-through holes which electrically interconnect the conductor configurations existing at the various planes of the composite board.

12. A multiplanar printed circuit board consisting of a stack of insulative sheets bonded together, said sheets having desired conductor configurations and associated circuit components adhered thereto and said board having continuously plated-through holes which electrically interconnect the conductor configurations existing at the various planes of the composite board.

References Cited in the file of this patent

UNITED STATES PATENTS

| | | |
|---|---|---|
| 2,481,951 | Sabee | Sept. 13, 1949 |
| 2,502,291 | Taylor | Mar. 28, 1950 |
| 2,864,156 | Cardy | Dec. 16, 1958 |
| 2,897,409 | Gitto | July 28, 1959 |
| 2,907,925 | Parsons | Oct. 6, 1959 |
| 2,912,748 | Gray | Nov. 17, 1959 |
| 2,955,351 | McCreadie | Oct. 11, 1960 |
| 2,990,310 | Chan | June 27, 1961 |
| 3,038,105 | Brownfield | June 5, 1962 |